(12) United States Patent
Aoki

(10) Patent No.: US 7,964,931 B2
(45) Date of Patent: Jun. 21, 2011

(54) SEMICONDUCTOR DEVICE

(75) Inventor: Hironori Aoki, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 385 days.

(21) Appl. No.: 12/212,735

(22) Filed: Sep. 18, 2008

(65) Prior Publication Data

US 2009/0085146 A1   Apr. 2, 2009

(30) Foreign Application Priority Data

Oct. 1, 2007  (JP) .................................. 2007-258086

(51) Int. Cl.
*H01L 29/66*  (2006.01)

(52) U.S. Cl. ........ 257/492; 257/331; 257/401; 257/409; 257/E29.014

(58) Field of Classification Search .................. 257/329, 257/331, 339, 365, 390, 401, 409, 492, 493, 257/495, E29.012, E29.013, E29.014, E29.024, 257/E29.025, E29.06, E29.07
See application file for complete search history.

(56) References Cited

U.S. PATENT DOCUMENTS

| | | | | |
|---|---|---|---|---|
| 6,919,610 | B2 * | 7/2005 | Saitoh et al. ................... | 257/492 |
| 7,595,542 | B2 * | 9/2009 | Park et al. ...................... | 257/495 |
| 2001/0028083 | A1 * | 10/2001 | Onishi et al. ................... | 257/328 |
| 2006/0043478 | A1 * | 3/2006 | Yamaguchi et al. .......... | 257/339 |

FOREIGN PATENT DOCUMENTS

JP           2003-86800            3/2003

* cited by examiner

*Primary Examiner* — Matthew C Landau
*Assistant Examiner* — Joseph C Nicely
(74) *Attorney, Agent, or Firm* — Oblon, Spivak, McClelland, Maier & Neustadt, L.L.P.

(57) ABSTRACT

A semiconductor device 1 includes a square substrate 2, first RESURF structures 3 in the shape of planar stripes on an element area 10 of a main surface of the substrate 2, a transistor T arranged between the first RESURF structures 3, a first high withstand voltage section 11 constituted by second RESURF structures 3a in the shape of planar strips on a periphery of the main surface of the substrate 2, and a second high withstand voltage section 12 constituted by third RESURF structures 3b which are symmetrically arranged at corners of the substrate 2 with respect to a diagonal line D of the main surface of the substrate 2.

17 Claims, 5 Drawing Sheets

US 7,964,931 B2

SEMICONDUCTOR DEVICE

CROSS REFERENCE TO RELATED APPLICATION

This application is based upon and claims the benefit of priority from the prior Japanese Patent Application No. 2007-258086 filed on Oct. 1, 2007, the entire contents of which is incorporated herein by reference.

BACKGROUND OF THE INVENTION

1. Field of the Invention

This invention relates to a semiconductor device, and more particularly relates to an electric power semiconductor device having a high withstand voltage structure.

2. Description of the Related Art

An electric power semiconductor device having a super-junction structure and including a vertical power MOSFET with a stripe cell structure is in wide use. Referring to FIG. 7 of the accompanying drawings, p type impurities are diffused via bottom surfaces and side surfaces of deep trenches 103 formed in an n type epitaxial layer 102, which is on an n type silicon substrate 101, thereby obtaining p type semiconductor regions 104 in the shape of a long column. The deep trench 103 is filled with an insulant 110. A RESURF (reduced surface field) structure is thus accomplished.

The vertical power MOSFET is fitted between the p type semiconductor regions 104, and has an n type drain region, a p type base region 105, an n type source region 106, a gate insulating film 107, and a gate electrode 108. The n type drain region is constituted by the n type epitaxial layer 102, and the n type silicon substrate 101. A drain electrode 111 is electrically connected to a rear surface of the n type silicon substrate 101 while a source electrode 112 is electrically connected to the n type source region 106 on a front surface of the n type silicon substrate 101.

With the foregoing electric power semiconductor device, when a voltage is applied across the drain electrode 111 and the source electrode 112, depletion layers spread from a pn junction on an interface between the p type semiconductor regions 104 and the n type epitaxial layer 102. When the applied voltage becomes equal to a given value, the depletion layer spreading from one p type semiconductor region 104 and the n type epitaxial layer 102 and the depletion layer spreading from another p type semiconductor region 104 and the n type epitaxial layer 102 are united each other. Therefore, the united depletion layer extends substantially over the n type epitaxial layer 102 sandwiched between the p type semiconductor regions 104, which weakens an electric field, and enables the electric power semiconductor device to have a high withstand voltage. However, at an area outside the RESURF structure which is at right and left parts shown in FIG. 7, neither the electric field is weakened nor the depletion layer expands sufficiently. Therefore, it is very difficult to accomplish the high withstand voltage.

As shown in FIG. 8, each deep trench 103 has a plurality of planar stripes on an element area at the central area of the n type epitaxial layer 102. The planar stripes extend in a Y-direction (from a third side 203 to a first side 202), and in an X-direction (from a fourth side 204 to a second side 202). The p type semiconductor regions 104 are made by diffusion onto the n type epitaxial layer 102 and along the deep trenches 103, and is in the shape of planar stripes. In other words, the deep trenches 103 and the p type semiconductor regions 104 have the RESURF structure in which the depletion layer extends in the Y-direction.

Further, with the power semiconductor device shown in FIG. 8, a high withstand voltage section exists at an element end area around the second side 202 and the fourth side 204 on a main surface of the n type epitaxial layer 102. The high withstand voltage section is in the shape of planar stripes extending in the X-direction, and is constituted by a plurality of trenches 103R arranged in the Y-direction, p type semiconductor regions 104R diffused on the n type epitaxial layer 102 and extending along the trenches 103R, and an insulant 110R filled in the trenches 103R. In short, the high withstand voltage section has the RESURF structure extending in the X-direction. When the applied voltage becomes equal to the given value and the depletion layer spreads on the n type epitaxial layer 102 and the p type semiconductor regions 104R, the high withstand voltage section reduces a difference between a total amount of positive charges on the n type epitaxial layer and a total amount of negative charges on the p type semiconductor regions 104R, balances the electric charges, and weakens the electric field.

The high withstand voltage section enables the depletion layer to efficiently and quickly spread not only in the Y-direction but also in the X-direction. Therefore, the high withstand voltage section can suppress concentration of the electric field and improve the withstand voltage (element withstand voltage) of the electric power semiconductor device.

It is assumed that the electric power semiconductor device includes the high withstand voltage section which has the RESURF structure not extending in the X-direction but extending only in the Y-direction. In such a case, when the applied voltage becomes equal to the given value, the depletion layer is prevented from extending in the X-direction by the insulant 110. In order to change adjacent RESURF layers into a depletion layer, it is necessary to make a route for discharging electron-hole from the RESURF layers.

For instance, such the route for discharging electron-hole can be secured by providing a wiring for electrically connecting the p type semiconductor regions 104 via the insulant 110 filled in the deep trenches 103. However, since the wiring enlarges the element end area, it is very difficult to improve an integration degree of the electric power semiconductor device. The high withstand voltage section shown in FIG. 8 is effective in extending the depletion layer, and improving the high withstand voltage of the electric power semiconductor device. One example of the foregoing electric power semiconductor device is disclosed in Japanese Patent Laid-Open Publication No. 2003-086800.

The electric power semiconductor device of FIG. 8 seems to suffer from the following problems: the depletion layer shown in FIG. 9 does not uniformly spread at a corner of the first side 201 and the fourth side 204, i.e., at a corner of the element end region, and concentration of the electric field and lowering of the withstand voltage are caused. Further, the foregoing problems have been observed all of four corners of the first to fourth sides 201 to 204.

SUMMARY OF THE INVENTION

The present invention is intended to provide a semiconductor device in which a depletion layer uniformly spreads at corners of a substrate, an electric field is weakened, and which improves a withstand voltage.

According to an aspect of the embodiment of the invention, there is provided a semiconductor device which includes: a square substrate having a first side and a second side which face with each other in a first direction and a third side and a fourth side which face with each other in a second direction, the first and second directions intersecting with each other; a plurality of RESURF regions having long sides which extend from the first side to the second side of the substrate at an element area on a main surface of the substrate, and including a plurality of flat stripes arranged from the third side to the fourth side of the substrate; semiconductor elements provided between the RESURF layers on the element area of the main surface of the substrate, and having a plurality of flat stripes arranged in the second direction; a first high withstand voltage section having long sides which extend in the second direction along the third and fourth sides at the element area of the main surface of the substrate, and including first trenches with a plurality of flat stripes arranged in the first direction; and a second high withstand voltage section including a plurality of second trenches which are symmetrically arranged with a diagonal line passing through corners of the main surface of the substrate, the corners being between near the first and second sides from the first high withstand voltage section at the element area of the main surface of the substrate.

With the foregoing semiconductor device, it is preferable that the first high withstand voltage section has the first trenches in the main surface of the substrate, an insulant filled in the first trenches, and first semiconductor regions provided on the main surface of the substrate and having electric conductivity opposite to electric conductivity of the substrate; the RESURF region has third trenches, an insulant filled in the third trenches, and second semiconductor regions provided on the main surface of the substrate and having electric conductivity opposite to the electric conductivity of the substrate; and one end each of the second semiconductor region is connected to the first semiconductor region. Further, it is preferable that the second high withstand voltage section has the second trenches in the main surface of the substrate, an insulant filled in the second trenches, and third semiconductor regions provided on the main surface of the substrate and having electric conductivity opposite to the electric conductivity of the substrate, the third semiconductor region being not connected to the first and second semiconductor regions.

Further, it is preferable that the second trenches include the third trenches extending in the first direction, and fourth trenches facing with the third trenches and symmetrically arranged with respect to the diagonal line; and a flat area defined by extensions of the third and fourth trenches along the diagonal line and having a shape of the letter L. In the second high withstand voltage section, the third trenches are apart from one another, the fourth trenches are apart from one another, and the third semiconductor regions extending along the third trenches and the third semiconductor regions extending along the fourth trenches are interconnected.

Still further, a planar shape of the second trenches of the second high withstand voltage section is preferably a square, a rectangle, a polygon having at least five straight sides and angles, a circle or an oblong.

It is preferable that each space between adjacent third semiconductor regions is designed to be equal or be gradually increased from the corner to the central area of the main surface of the substrate. Each space between adjacent third semiconductor regions is preferably designed to be equal to or smaller than the space between the adjacent first semiconductor regions. Further, the second trenches of the second high withstand voltage section are as deep as the first trenches of the first high withstand voltage section.

The present invention can provide the semiconductor device in which the depletion layer is uniformly spread at corners of the substrate, and which can alleviate the concentration of the electric field, and improve the high withstand voltage performance.

DETAILED DESCRIPTION OF THE INVENTION

Figure 1:
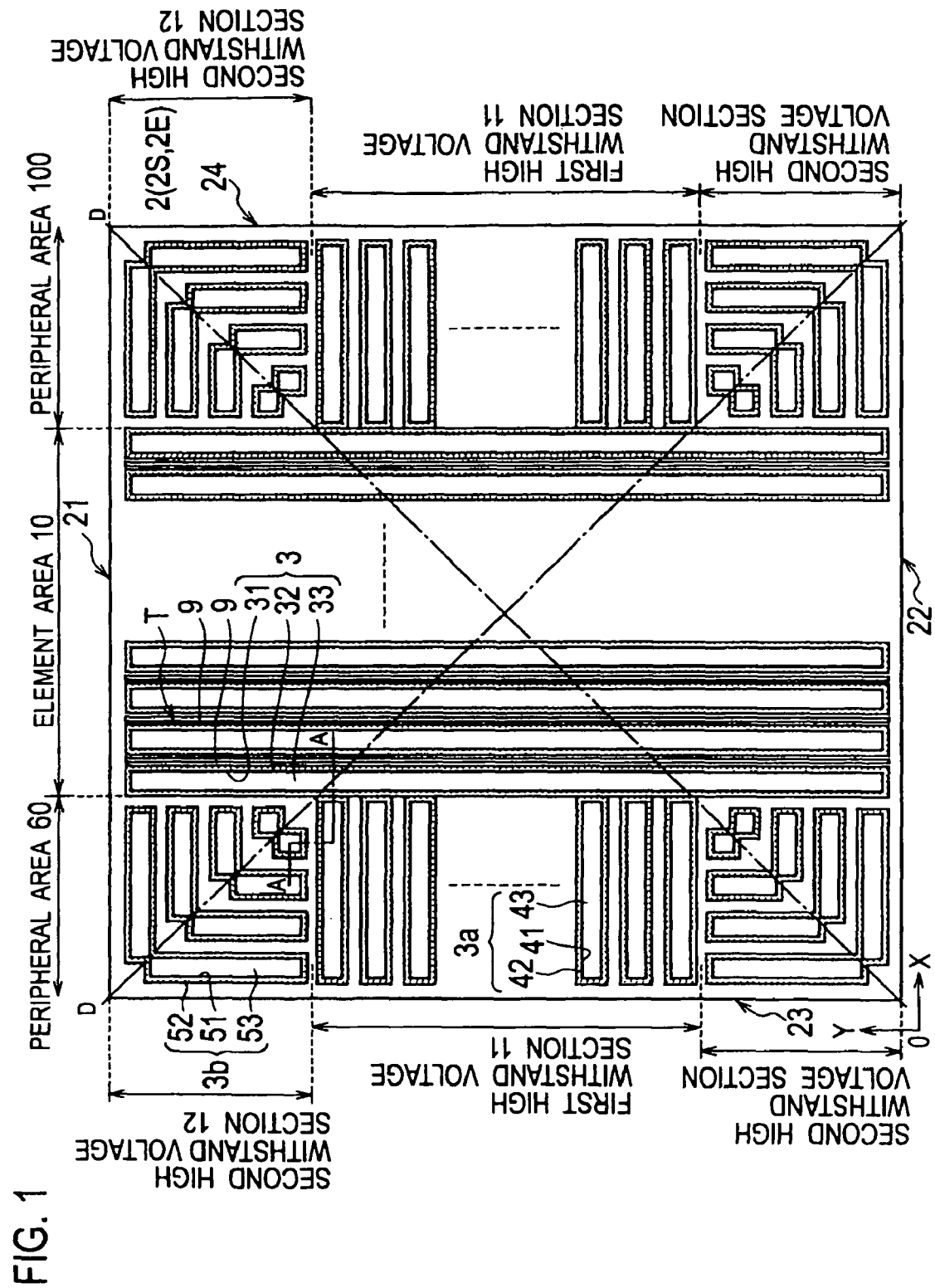
FIG. 1 is a top plan view of a semiconductor device according to a first embodiment of the invention.

The invention will be described with reference to some embodiments shown in the drawings. Like or corresponding parts are denoted by like or corresponding reference numerals. Components shown in the drawing figures are schematic, and may be sometimes different from those of actual parts. Further, scales or ratios of components may vary in drawings.

The following exemplify devices to bring the technical concept of the invention into shape. The technical concept of the invention does not always refer to specific arrangements of components constituting the semiconductor device. Further, numerous modifications and variations could be made to the technical concept of the invention without departing from the scope of the invention set forth in the claims.

First Embodiment

A first embodiment of the invention relates to an electric power semiconductor device including a vertical power transistor.

Figure 2:
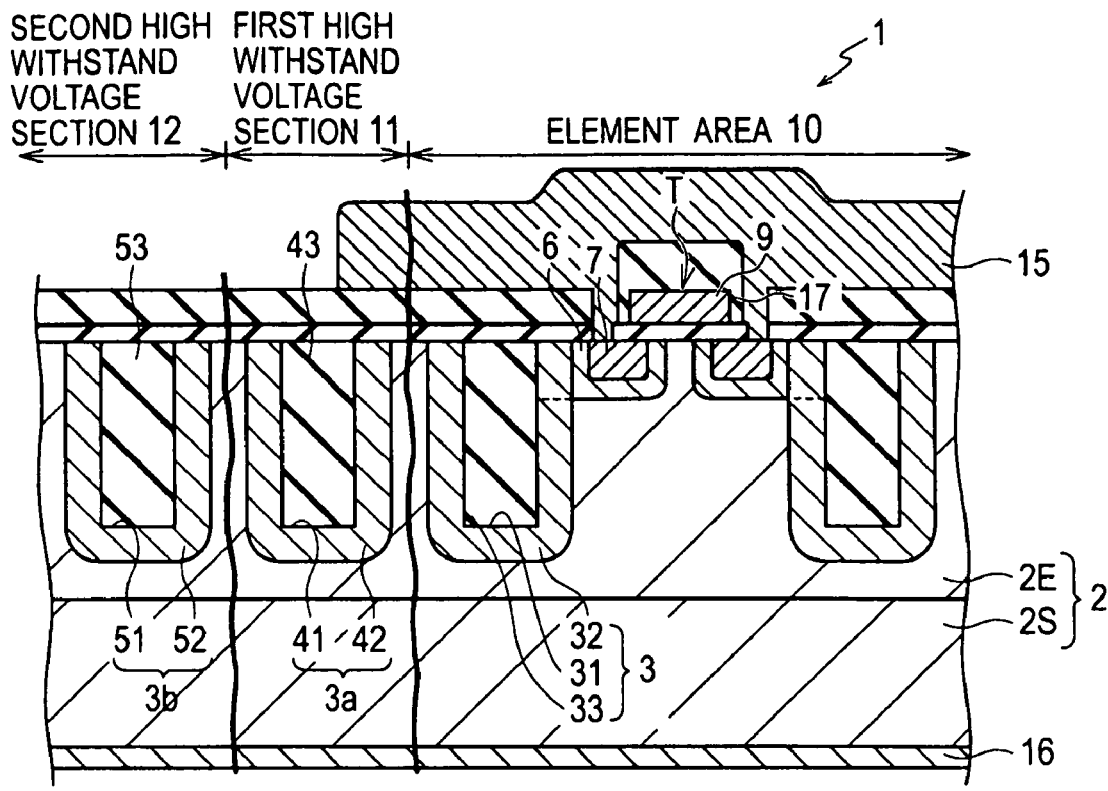
FIG. 2 is a cross-sectional view of the semiconductor device of FIG. 1, taken along line A-A in FIG. 1.

Referring to FIG. 1 and FIG. 2, a semiconductor device 1 includes: a planar rectangular substrate 2; a plurality of first RESURF structures 3 being in the shape of flat stripes, positioned at the central area of a main surface of the substrate 2 and having a long side extending in a direction (Y-direction) between a first side 21 (shown at an upper part in FIG. 1) and a second side 22 (shown at a lower part in FIG. 1) of the substrate 2 and in a direction (X-direction) between a third side 23 (shown at a left part in FIG. 1) adjacent to the first side 21 and a fourth side 24 (shown at a right part in FIG. 1), the first side 21 and the second 22 facing with each other, and the third side 23 and the fourth side 24 facing with each other; a transistor T, for instance, between the first RESURF structures 3 at the central area of the substrate 2; a first high withstand voltage section 11 having a second RESURF structure 3a in which a long side extends in a second direction between the third side 23 and the fourth side 24 at a peripheral area 60 (element end area) around the third and fourth sides 23 and 24, the first withstand voltage section 11 surrounding the central area of the substrate 2; and a second withstand voltage section 12 having a third RESURF structure 3b, surrounding the first withstand voltage section 11 via the first and second sides 21 and 22a, being symmetrically arranged with respect to a diagonal line passing through the corner of the first and second sides.

In the first embodiment, the substrate 2 includes a n type semiconductor region 2S, and a n type semiconductor region 2E which has undergone epitaxial growth on the n type semiconductor region 2S. The n type semiconductor region 2S is a first semiconductor region. The n type semiconductor region 2E is a second semiconductor region. The n type semiconductor region 2E is designed to have a low impurity density compared to that of the n type semiconductor region 2S, e.g. $5 \times 10^{14}$ atoms/cm$^3$ to $5 \times 10^{15}$ atoms/cm$^3$.

Each first RESURF structure 3 has trenches 31 formed on the n type semiconductor region 2E of the element area 10, a p type semiconductor region (RESURF layer) 32 provided on the n type semiconductor region 2E along the trenches 31, and an insulant 33 filled in the trenches 31. The trenches 31 have a long and thin planar shape in the first direction, and are 40 μm to 70 μm deep, for instance. Further, a space between adjacent trenches 31 is 10 μm to 20 μm. The p type semiconductor region 32 is formed by diffusing p type impurities onto the n type semiconductor region 2E via the bottom and side surfaces of the trenches 31. The p type semiconductor region 32 is designed to have an impurity density of $7 \times 10^{14}$ atoms/cm$^3$ to $9 \times 10^{15}$ atoms/cm$^3$, for instance. A silicon oxide film is suitable for practical use as the insulant 33.

The transistor T includes: the n type substrate 2 partly exposed on a main surface section; a p type base region 6 disposed adjacent to the n type substrate 2 and exposed on one main surface (an upper surface) of the n type substrate 2; an n type source region 7 disposed adjacent to the p type base region 6 and exposed on one main surface section of the n type substrate 2; a gate oxide film 8 disposed on the p-type base region 6 and n type source region 7 which are exposed on the main surface section of the n type substrate 2; a gate electrode 9 on the gate insulating film 8; a drain electrode 16 placed on the other main surface section of the n type substrate 2; and a source electrode 15 which connects to the n type source region 7 and partly extends to a peripheral region 60. The source electrode 15 may be connected to the p type base region 6. In short, a vertical power transistor, and more specifically a vertical power MOSFET is used as the transistor T in the first embodiment.

The first high withstand voltage section 11 has the second RESURF structure 3a, and is constituted by: trenches (first trenches) 41 made in the n type semiconductor region 2E; a p type semiconductor region (RESURF layer) 42 disposed on the n type semiconductor region 2E along the trenches 41; and an insulant 43 filled in the trenches 41. Each trench 41 has a long and thin planar shape and extends in the second direction. One end each (near the element area 10) of the trench 41 stands off from each trench 31 while the other end each of the trench 41 (near an end of the substrate 2) does not reach the peripheral area of the semiconductor device 1. Further, one end (near the element area 10) of the p type semiconductor region 42 is connected to the p type semiconductor region 32 near the element area 10.

In order to prevent an increase of manufacturing processes of the semiconductor 1 device, the first high withstand voltage section 11 and the first RESURF structures 3 of the element area 10 are manufactured in the same process. Therefore, the trenches 41 of the first high withstand voltage section 11 are as deep as the trenches 31 of the element area 10. Density of the impurities of the p type semiconductor region (RESURF layer) 42 is the same as that of the p type semiconductor region 32. An electric potential applied to the p type semiconductor region (RESURF layer) 32 which is at the outermost peripheral area of the element area 10 is carried in onto the p type semiconductor region 42, so that a source potential is effectively applied. The insulant 42 of the first high withstand voltage region 11 is made of the material same as the insulant 33 of the first RESURF structure 3. Further, the source electrode 15 extends toward the first high withstand voltage region 11 as shown in FIG. 2.

The second high withstand voltage region 12 has the third RESURF structure 3b, and includes second trenches 51 on a surface thereof, p type semiconductor regions (RESURF layers) 52 formed on the n type semiconductor region 2E and extending along the second trenches 51, and an insulant 53 filled in the second trenches 51. Similarly to the first high withstand voltage section 11, the second high withstand voltage section 12 is made together with the first RESURF structures 3 in the same manufacturing process in order to prevent an increase of the manufacturing processes of the semiconductor device 1. Therefore, the trenches 51 of the second high withstand voltage section 12 are as deep as the trenches 31 of the element area 10. Density of the impurities of the p type semiconductor regions (RESURF layers) 52 is the same as that of the p type semiconductor region 32. The p type semiconductor region 52 is not electrically connected to the p type semiconductor regions 32 and 42, and is in a floating state. An insulant 53 of the second high withstand voltage section 12 is made of the material same as that of the insulant 33 of the first RESURF structure 3.

Figure 3:
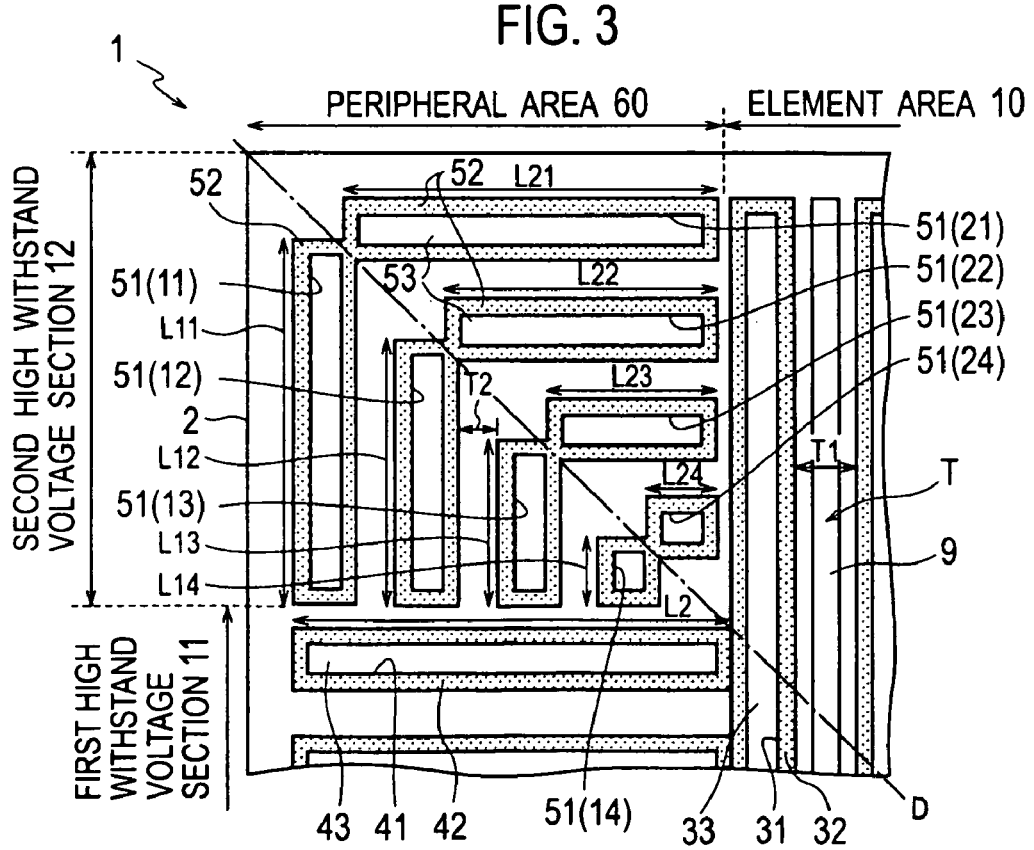
FIG. 3 is an enlarged top plan view of an essential part of the semiconductor device of FIG. 1.

Referring to FIG. 1 and FIG. 3, the second high withstand voltage section 12 has not only second trenches 51(11), 51(12), 51(13) and 51(14) which extend in the first direction but also second trenches 51(21), 51(22), 51(23) and 51(24) which are symmetrically located with respect to the diagonal line D and extend in the second direction. Since the third RESURF structure is symmetrical, a length L11 of the second trench 51(11) is equal to a length L21 of the second trench 51(21), and the p type semiconductor regions 52 provided along the second trenches 51 are identically shaped. Similarly, a length L12 of the second trench 51(12) is equal to a length L22 of the second trench 51(22), and the p type semiconductor regions 52 provided along the second trenches 51 are identically shaped. A planar shape where an extension of the second trench 15(11) and an extension of the second trench 51(21) are joined has a shape of letter L which is bent along the diagonal line D. A planar shape where an extension of the second trench 15(12) and an extension of the second trench 51(22) are joined has a shape of letter L which is bent along the diagonal line D. Further, a planar shape where an extension of the second trench 15(13) and an extension of the second trench 51(23) are joined has a shape of letter L which is bent along the diagonal line D. Still further, a planar shape where an extension of the second trench 15(14) and an extension of the second trench 51(24) are joined has a shape of letter L which is bent along the diagonal line D.

As shown in FIG. 3, respective ends of the second trenches 51(11), 51(12), 51(13) and 51(14) are set apart from the first trench 41 which is nearest the second high withstand voltage section 12 at the corner formed by the first side 21 and third side 23 of the first high withstand voltage section 11. Similarly, respective ends of the second trenches 51(21), 51(22), 51(23) and 51(24) are set apart from the first trenches 31 which are nearest the second high withstand voltage section 12 at the corner formed by the first side 21 and third side 23 of the first high withstand voltage section 11.

Figure 4:
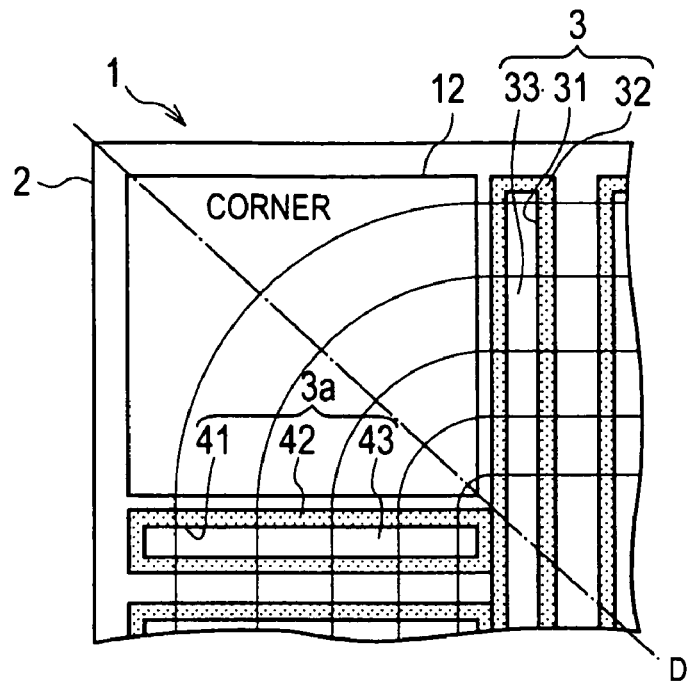
FIG. 4 is a schematic view showing how an ideal depletion layer spreads at the essential part of the semiconductor device of FIG. 1.

Referring to FIG. 4, when a voltage applied to the drain electrode 16 is higher than a voltage applied to the source electrode 15, depletion layers spread, at the element area 10, from pn junctions at an interface between the p type semiconductor regions 32 and the n type semiconductor regions 2E. Once the applied voltage becomes equal to the given value, the depletion layer spreading from one p type semiconductor region 32 and one n type semiconductor region 2E is united with the depletion layer spreading from the other p type semiconductor region 32 and the other n type semiconductor region 2E. Therefore, the united depletion layer spreads all over the element area 10 at the n type semiconductor region 2E sandwiched between the p type semiconductor regions 32.

In the first high withstand voltage section 11, the p type semiconductor regions 32 nearest the first high withstand voltage section 11 and a plurality of p type semiconductor regions 42 in the first high withstand voltage section 11 are connected, so that a potential at a connecting part of the p type semiconductor region 32 is carried in onto a potential at a connecting part of the p type semiconductor region 42. Therefore, a depletion layer spreads at the first high withstand voltage section 11 in the n type semiconductor region 2E sandwiched between the p type semiconductor regions 42.

When a reverse bias is applied, the depletion layer spreads around the p type semiconductor region 42 of the first withstand voltage section 11 and the p type semiconductor region 32 of the element area 10. If the voltage becomes equal to or larger than the given value, the depletion layer extends from the first withstand voltage section 11 and the element area 10 to the second high withstand voltage section 12, and gets to the second high withstand voltage section 12 adjacent to the first high withstand voltage part 11 and the p type semiconductor range 25 adjacent to the element area 10 before undergoing an electronic avalanche. This alleviates a concentration of the electric field at the corners. If the voltage is further raised, the electric field in the p type semiconductor region 52 is increased. However, the depletion layer gets to the p type semiconductor region 52 near the corner before undergoing the electronic avalanche. This is also effective in alleviating the concentration of the electric field at the corners. The foregoing processes are repeated until the applied voltage becomes equal to the given value, so that the depletion layer reaches the p type semiconductor region 52 which is nearest the corners. The concentration of the electric field can be efficiently alleviated at the corners in the semiconductor device 1 according to the invention.

When the depletion layer concentrically spreads (i.e., a potential distribution) in the second high withstand voltage section 12 as shown in FIG. 4, the withstand voltage becomes highest. In order to make the depletion layer spread approximately concentrically in the second high withstand voltage section 12, the second trenches 51 and the p type semiconductor regions 52 are symmetrically arranged with respect to the diagonal line D.

Further, in the second high voltage withstand section 12, the second trench 51(11) and the second trench 51(21) are set apart from each other. The p type semiconductor region 52 extending along the second trench 51(11) and the p type semiconductor region 52 extending along the second trench 51(12) are mutually joined. The second trench 51(12) and the second trench 51(22) are set apart from each other. The p type semiconductor region 52 extending along the second trench 51(12) and another p type semiconductor region 52 extending along the second trench 51(22) are mutually joined. The same holds true to the remaining p type semiconductor regions 52.

In the second high withstand voltage section 12, the second trenches 51 are long and narrow. Since the insulant 53 is filled in the second trenches 51 mainly via longer sides thereof, it is possible to prevent voids caused by the filling of the insulant 53. Further, the second trench 51(11) and the second trench 51(21) do not intersect with each other at right angles, so that it is possible to prevent voids from being caused by the insulant 53, and to block spreading of the depletion layer.

In the first embodiment, the spaces T2 between the p type semiconductor regions 52 extending along the second trenches 51(11), 51(12), and so on, and the second trenches 51(21), 51(22), and so on are designed to be equal to the spaces T1 between the p type semiconductor regions 32 extending along the trench 31 of the first RESURF structure 3.

As described so far, since the depletion layer on the second high withstand voltage section 12 at the corners of the substrate 2 can spread concentrically, the withstand voltage can be increased. For instance, the following are assumed: the impurity density of the n type semiconductor region 2E is $7.5 \times 10^{14}$ atoms/cm$^3$; the second trenches 51 are 50 μm deep; each space between adjacent second trenches 51 is 11 μm; and the impurity density (RESURF density) of the p type semiconductor region 52 is $1.3 \times 10^{15}$ atoms/cm$^3$. In this case, a withstand voltage of equal to or above 600 V can be accomplished when the element end region is 180 μm long.

Second Embodiment

In a second embodiment of the invention, a semiconductor device 1 includes a second high withstand voltage section 12 whose RESURF layer has a shape different from the planar shape of the second high withstand voltage section 12 of the first embodiment.

Figure 5:
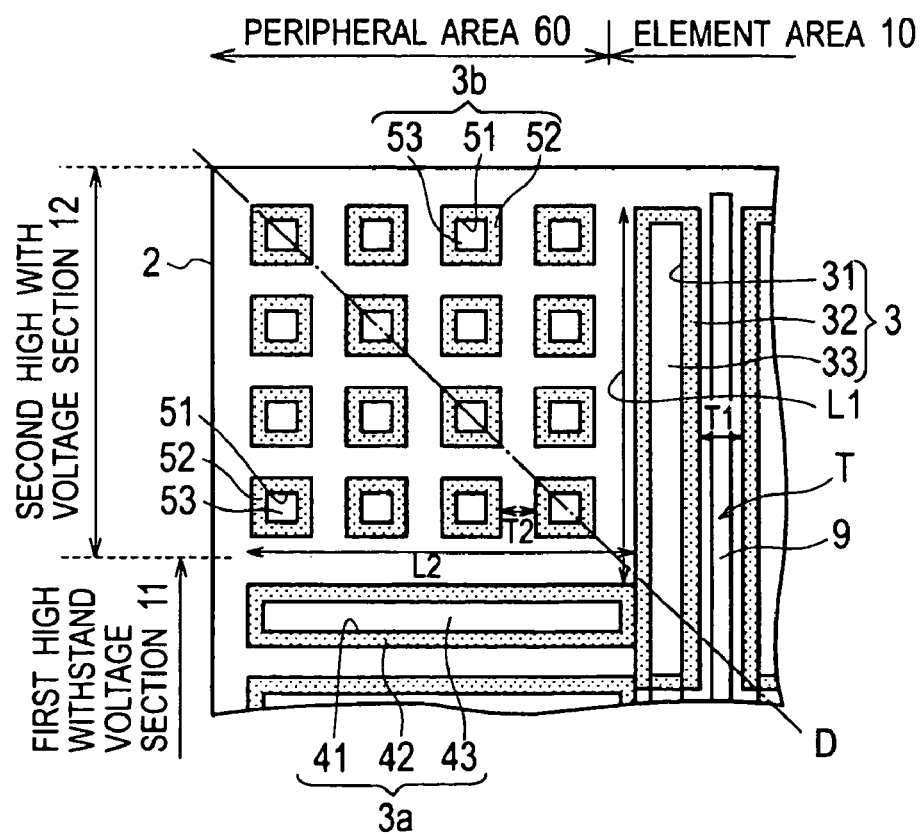
FIG. 5 is an enlarged top plan view of a semiconductor device according to a second embodiment of the invention.

Referring to FIG. 5, the second high withstand voltage section 12 of this embodiment includes second trenches 51 in the shape of a square. The p type semiconductor regions (RESURF layers) 52 are provided on the n type semiconductor region 2E and along the second trenches 51. The insulant 53 is filled in the second trenches 51. Similarly to the second high withstand voltage section 12 of the first embodiment, the second trenches 51 and the p type semiconductor regions 52 are symmetrically arranged with respect to the diagonal line D. In other words, the RESURF layers are freckled on the second high withstand voltage section 12. With the high withstand voltage section 12, the length L1 in the first direction is equal to the length L2 in the second direction.

In the second high withstand voltage section 12, as the depletion layer (potential) gradually spreads, the electric field can be weakened. Further, the depletion layer spreads substantially concentrically, which is effective in improving the high withstand voltage performance. In the second embodiment, the spaces T2 between adjacent p type semiconductor regions 52 arranged along the second trenches 51 are smaller than the spaces T1 between adjacent p type semiconductor regions 52 arranged along the trenches 31 of the first RESURF structure 3, which is effective in promoting spreading of the depletion layer. It is preferable that the spaces T1 between the adjacent p type semiconductor regions 52 are gradually reduced toward the central area of the main surface of the substrate 2 from the corner of the main surface of the substrate 2, which promotes spreading of the depletion layer.

The semiconductor device 1 of the second embodiment is as effective as the semiconductor device 1 of the first embodiment.

Needless to say, the second trenches 51 of the second high withstand voltage section 12 is not always limited to squares but may be rectangles, polygons with four or more straight sides and angles, circles or oblongs.

Third Embodiment

In a third embodiment, the second high withstand voltage section 12 has a RESURF structure of which arrangement is somewhat different from the RESURF structure in the first or second embodiment.

Figure 6:
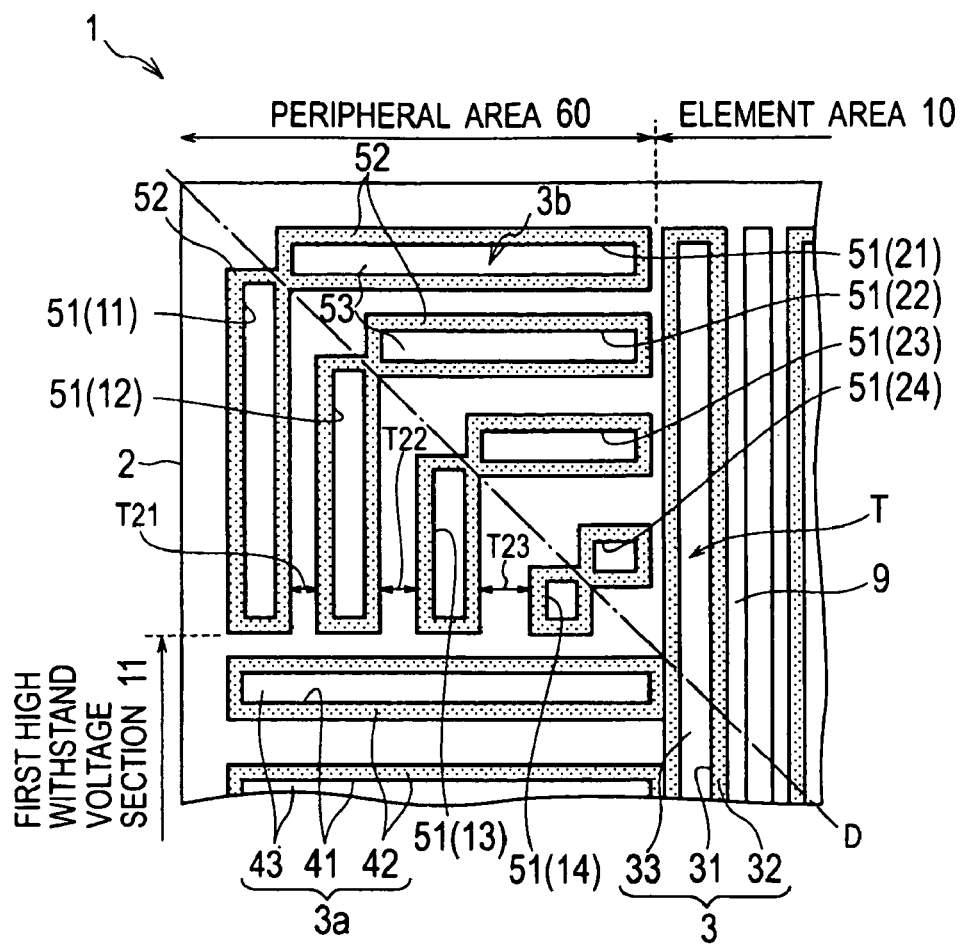
FIG. 6 is an enlarged top plan view of a semiconductor device according to a third embodiment of the invention.
Figure 7:
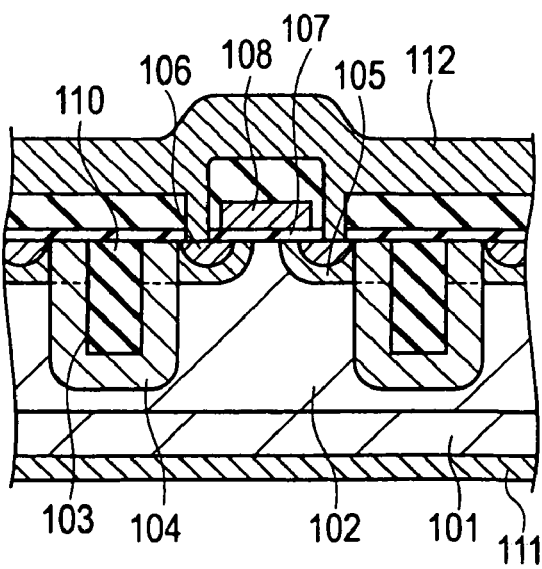
FIG. 7 is a cross-sectional view of a semiconductor device of the related art.
Figure 8:
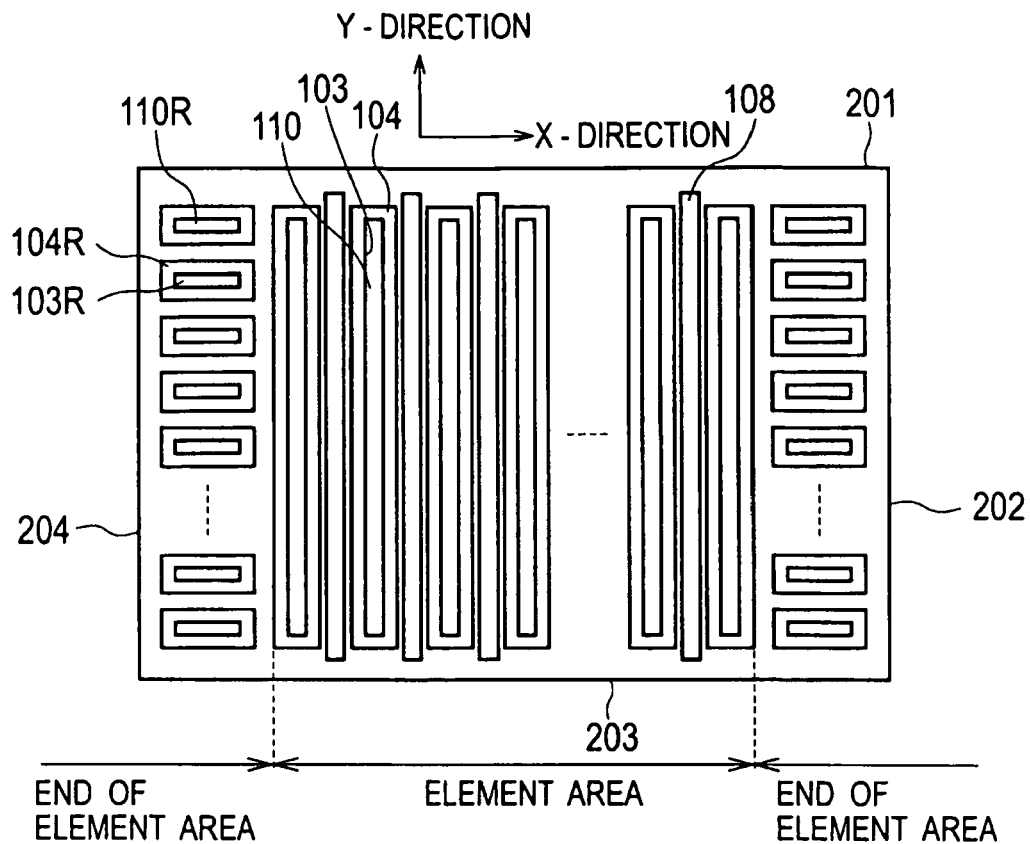
FIG. 8 is a top plan view of the semiconductor device of the related art.
Figure 9:
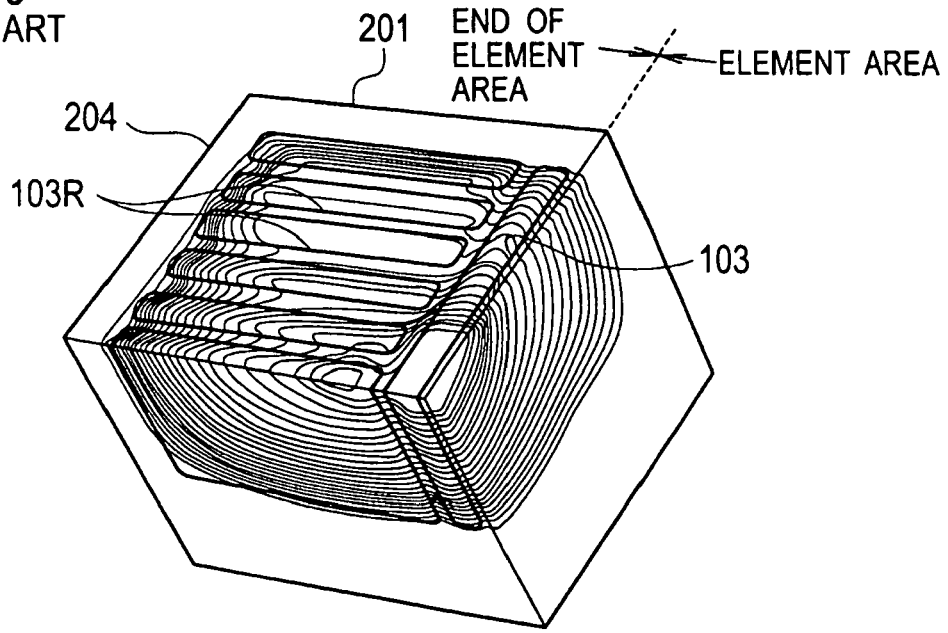
FIG. 9 is a perspective view of the semiconductor device of the related art.

Referring to FIG. 6, spaces between adjacent second trenches 51 or p type semiconductor regions 51 gradually become large toward the central area of the substrate 2 from the corner of the substrate 2. In other words, the spaces T21, T22 and T23 between the adjacent second trenches 51 and the p type semiconductor regions 52 (RESURF layers) are defined to be:

T21<T22<T23.

In the third embodiment, it is possible to promote spreading of the depletion layer on the second high withstand voltage section 12, and to improve the withstand voltage performance.

Other Embodiments

While the invention has been described by means of specific embodiments and applications thereof, numerous modifications and variations could be made thereto without departing from the scope of the invention set forth in the claim. The present invention uses the vertical power MOSFET as the semiconductor element in the element area 10. Alternatively, a vertical IGBT, a transistor, a diode, or the like may be mounted on the element area 10.

What is claimed is:

1. A semiconductor device comprising:
   a square substrate having a first side and a second side which face each other in a first direction and a third side and a fourth side which face each other in a second direction, the first and second directions intersecting with each other;
   a plurality of reduced surface field (RESURF) regions having long sides which extend from the first side to the second side of the substrate in an element area on a main surface of the substrate, and including a plurality of flat stripes arranged from the third side to the fourth side of the substrate;
   semiconductor elements provided between the RESURF regions on the element area of the main surface of the substrate, and having a plurality of flat stripes arranged in the second direction;
   a first high withstand voltage section having long sides which extend in the second direction along the third and fourth sides in a peripheral area of the main surface of the substrate, and including first trenches with a plurality of flat stripes arranged in the first direction; and
   a second high withstand voltage section including a plurality of second trenches which are symmetrically arranged with a diagonal line passing through corners of the main surface of the substrate, wherein the first high withstand voltage section has the first trenches in the main surface of the substrate, an insulant filled in the first trenches, and first semiconductor regions provided on the main surface of the substrate and having electric conductivity opposite to electric conductivity of the substrate; the RESURF regions each have a third trench, an insulant filled in the third trench, and a second semiconductor region provided on the main surface of the substrate and having electric conductivity opposite to the electric conductivity of the substrate; and one end of each of the first semiconductor regions is physically connected to an adjacent second semiconductor region.

2. The semiconductor device according to claim 1, wherein the second high withstand voltage section has the second trenches in the main surface of the substrate, an insulant filled in the second trenches, and a third semiconductor region provided on the main surface of the substrate and having electric conductivity opposite to the electric conductivity of the substrate, the third semiconductor region being not connected to the first and second semiconductor regions.

3. The semiconductor device according to claim 2, wherein the second trenches include the fourth trenches extending in the first direction, and fifth trenches facing with the fourth trenches and symmetrically arranged with respect to the diagonal line; and a flat area of the substrate between edges of adjacent fourth trenches and adjacent fifth trenches along the diagonal line having a shape of the letter L.

4. The semiconductor device according to claim 2, wherein a planar shape of the second trenches of the second high withstand voltage section is a square, a rectangle, a polygon having at least five straight sides and angles, a circle or an oblong.

5. The semiconductor device according to claim 2, wherein each space between adjacent third semiconductor regions is designed to be equal to or smaller than the space between the adjacent first semiconductor regions.

6. The semiconductor device according to claim 2, wherein the second trenches of the second high withstand voltage section are as deep as the first trenches of the first high withstand voltage section.

7. The semiconductor device according to claim 3, wherein in the second high withstand voltage section, the fourth trenches are apart from one another, the fifth trenches are apart from one another, and the third semiconductor regions extending along the fourth trenches and the third semiconductor regions extending along the fifth trenches are interconnected.

8. The semiconductor device according to claim 3, wherein each space between adjacent third semiconductor regions is designed to be equal from the corner to the central area of the main surface of the substrate.

9. The semiconductor device according to claim 8, wherein each space between adjacent third semiconductor regions is designed to be equal to or smaller than the space between the adjacent first semiconductor regions.

10. The semiconductor device according to claim 3, wherein each space between adjacent third semiconductor regions is designed to be gradually increased from the corner to the central area of the main surface of the substrate.

11. The semiconductor device according to claim 10, wherein each space between adjacent third semiconductor regions is designed to be equal to or smaller than the space between the adjacent first semiconductor regions.

12. The semiconductor device according to claim 3, wherein the second trenches of the second high withstand voltage section are as deep as the first trenches of the first high withstand voltage section.

13. The semiconductor device according to claim 7, wherein each space between adjacent third semiconductor regions is designed to be equal from the corner to the central area of the main surface of the substrate.

14. The semiconductor device according to claim 7, wherein each space between adjacent third semiconductor regions is designed to be gradually increased from the corner to the central area of the main surface of the substrate.

15. The semiconductor device according to claim 7, wherein the second trenches of the second high withstand voltage section are as deep as the first trenches of the first high withstand voltage section.

16. The semiconductor device according to claim 1, wherein a planar shape of the second trenches of the second high withstand voltage section is a square, a rectangle, a polygon having at least five straight sides and angles, a circle or an oblong.

17. The semiconductor device according to claim 1, wherein the second trenches of the second high withstand voltage section are as deep as the first trenches of the first high withstand voltage section.

\* \* \* \* \*